(12) United States Patent
Gordon

(10) Patent No.: US 9,790,378 B2
(45) Date of Patent: Oct. 17, 2017

(54) VAPOR SOURCE USING SOLUTIONS OF PRECURSORS IN TERPENES

(75) Inventor: Roy Gerald Gordon, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 748 days.

(21) Appl. No.: 13/996,485

(22) PCT Filed: Dec. 16, 2011

(86) PCT No.: PCT/US2011/065381
§ 371 (c)(1),
(2), (4) Date: Jan. 6, 2014

(87) PCT Pub. No.: WO2012/087794
PCT Pub. Date: Jun. 28, 2012

(65) Prior Publication Data
US 2014/0120256 A1    May 1, 2014

Related U.S. Application Data

(60) Provisional application No. 61/426,808, filed on Dec. 23, 2010.

(51) Int. Cl.
*H01L 21/316* (2006.01)
*C09D 7/12* (2006.01)
*C23C 16/18* (2006.01)
*C23C 16/34* (2006.01)
*C23C 16/448* (2006.01)

(52) U.S. Cl.
CPC ............ *C09D 7/1233* (2013.01); *C23C 16/18* (2013.01); *C23C 16/34* (2013.01); *C23C 16/448* (2013.01)

(58) Field of Classification Search
CPC ....... C09D 7/1233; C23C 16/18; C23C 16/34; C23C 16/448
See application file for complete search history.

(56) References Cited

U.S. PATENT DOCUMENTS

| 4,689,247 A | 8/1987 | Doty et al. |
| 4,690,984 A * | 9/1987 | Veazey et al. ............. 525/332.3 |
| 6,180,190 B1 | 1/2001 | Gordon |

(Continued)

OTHER PUBLICATIONS

Huelin, F. E. and Murray, K. E., "α-Farnesene in the Natural Coating of Apples," Nature, vol. 210, pp. 1260-1261 (Jun. 18, 1966).

(Continued)

*Primary Examiner* — Alexander Polyansky
(74) *Attorney, Agent, or Firm* — Wilmer Cutler Pickering Hale and Dorr LLP

(57) ABSTRACT

This disclosure relates to terpene solutions of metal precursors used for chemical vapor deposition, atomic layer deposition, spray pyrolysis or misted deposition. The terpenes do not supply impurities such as oxygen or halogens to the material being produced, nor do they etch or corrode them. In spray pyrolysis or misted deposition, small droplets provide uniform coating. Terpenes have high flash points and low flammability, reducing the risk of fires. Terpenes have low toxicity and are biodegradable. They are available in large amounts from renewable, natural plant sources, and are low in cost.

21 Claims, 3 Drawing Sheets

(56) References Cited

U.S. PATENT DOCUMENTS

2003/0027904 A1* 2/2003 Cordova .................. B05D 7/02
524/107
2008/0119098 A1* 5/2008 Palley ................... C23C 16/305
442/64
2008/0254232 A1 10/2008 Gordon et al.

OTHER PUBLICATIONS

International Search Report and Written Opinion issued by the U.S. Patent and Trademark Office as International Searching Authority for International Application No. PCT/US11/65381 dated Apr. 19, 2012 (10 pages).
Mamula, O. and von Zelewsky, A., "Supramolecular coordination compounds with chiral pyridine and polypyridine ligands derived from terpenes," Coordination Chemistry Reviews, vol. 242, pp. 87-95 (2003).
Nieuwenhuizen, N. J., et al., "Two terpene synthases are responsible for the major sesquiterpenes emitted from the flowers of kiwifruit (*Actinidia deliciosa*)," Journal of Experimental Botany, vol. 60, No. 11, pp. 3203-3219 (2009).
Schulz, S., et al., "New terpene hydrocarbons from the alligatoridae (crocodylia, reptilia)," J. Nat. Prod., vol. 66, No. 1, pp. 34-38 (2003).

* cited by examiner

VAPOR SOURCE USING SOLUTIONS OF PRECURSORS IN TERPENES

RELATED APPLICATIONS

The present application is a national stage application of International Application No.: PCT/US2011/065381, filed on Dec. 16, 2011, which claims the benefit of the earlier filing date U.S. Patent Application No. 61/426,808, filed on Dec. 23, 2010, the contents of which are hereby incorporated by reference herein.

BACKGROUND

This disclosure relates to vapor deposition of materials, including chemical vapor deposition (CVD), atomic layer deposition (ALD), spray pyrolysis (SP) and misted deposition (MD).

In CVD processes, vapors of one or more precursors are directed over a substrate on which material is deposited as a product of chemical reaction(s) of the precursor vapor(s).

In ALD processes, two precursor vapors are alternately directed onto a surface on which their reaction product is deposited.

In SP processes, droplets of a liquid or solution of the chemical precursor are directed at a heated substrate on which a material is deposited.

In MD processes, droplets of a liquid or solution are directed onto the surface of a substrate on which they coalesce to form a liquid film. This wet substrate is then treated or cured by heating, irradiation with light or other means to induce reaction to produce the desired material on the substrate.

When a precursor is a solid material, a solvent is often used to dissolve the precursor. Then the solution of the precursor is used in one of these processes. The solvent must be chosen so that its presence does not interfere with the deposition process. It may be chemically inert in the conditions of the deposition, or it may even contribute to the chemical process as a reagent.

It has been found in practice that it is very difficult to find solvents that meet all the requirements for deposition processes using these solutions.

SUMMARY

It has surprisingly been discovered that solvents comprising acyclic terpenes are useful for vapor deposition or spray deposition.

To be useful for vapor or spray deposition, a solvent should meet many requirements. The solvent should readily dissolve a high concentration of the precursor, so that unnecessarily large volumes of solution do not need to be processed.

The solvent should not contribute undesired impurities to the deposited material. For example, in depositing a pure metal, solvents containing oxygen should be avoided because oxygen may contaminate the metal film. Similarly, solvents containing halogens may produce material with halogen impurities.

The solvent should not etch or dissolve the film, because the films may become etched or pitted, or may even fail to form in the presence of such a solvent. The solvent should not corrode or etch the substrate or the deposition equipment. Similarly, any reaction byproducts or decomposition products should not be corrosive. Solvents containing halogens are particularly prone to cause etching or corrosion.

The vapor pressures of the solvent and the precursor should be reasonably close to each other. If the solvent has a much higher vapor pressure than the precursor, then the solvent may evaporate prematurely, clogging the equipment with solid precursor. If the solvent has a much lower vapor pressure than the precursor, then solvent vapor may contaminate the deposited material or it may re-condense in places where it is not wanted in the equipment.

The viscosity and surface tension of a solvent should be low enough so that small droplets can be formed easily and without requiring the use of excessive amounts of energy. Small droplets evaporate more quickly than large droplets, avoiding possible decomposition of the precursors during the evaporation process needed for CVD and ALD. Small droplets aid in making more uniform coatings by SP and MD.

To reduce the risk of accidental fires, the solvent and solutions should not be flammable.

An ideal solvent should not be toxic to humans, animals or plants, nor should its disposal cause any deleterious effects on the environment. An ideal solvent should also be biodegradable.

The solvent should be available in sufficiently large amounts and from multiple sources so that an ample supply is reliably available. Renewable, natural and local sources are preferred over petrochemical sources whose supply chain is more subject to disruption and depletion.

The cost of the solvent should be low, and it should be easy and inexpensive to recycle or dispose of the solvent after its use.

It has surprisingly been discovered that solvents comprising acyclic terpenes meet all of the above requirements. Monoterpenes, sesquiterpenes or diterpenes generally provide the closest match between the vapor pressure of the solvent and the precursor. Monoterpenes have the highest vapor pressures (lowest boiling points), while sesquiterpenes have lower vapor pressures, and diterpenes have still lower vapor pressures (highest boiling points).

Terpenes have been found to be good solvents, which dissolve large concentrations of precursors, particularly of nonpolar precursors. Especially high solubility is found in acyclic, polyunsaturated terpenes. Acyclic monoterpenes typically have three double bonds in each molecule, while acyclic sesquiterpenes usually have four double bonds per molecule and acyclic diterpenes have up to five double bonds per molecule.

In some embodiments, a terpene solution of a precursor is vaporized and used as a source for a CVD process or an ALD process.

In other embodiments, a terpene solution of a precursor is dispersed into droplets and used as a source for SD or MD.

In some embodiments, the terpene is a monoterpene. In other embodiments, the terpene is a sesquiterpene. In still other embodiments, the terpene is a diterpene. In embodiments using precursors with very low vapor pressure, still larger terpenes with 5 or 6 or more isoprene units may be used, such as triterpenes.

Terpene solutions have low enough viscosity and surface tension so that they may be broken into small droplets easily by conventional nebulization methods, including spray nozzles and ultrasonic nebulizers.

Many of the terpene solutions have flash points high enough to be classified as combustible liquids, rather than flammable liquids. This means that at ambient temperatures, their vapors cannot be ignited by an ignition source without additional heating. Handling and transporting combustible liquids poses less danger of accidental fire than is present with flammable liquids.

Terpenes are natural products present in many plants, including edible fruits and spices. Most acyclic, unsaturated terpenes are not toxic and many are approved as components of human foods, flavorings, cosmetics and fragrances. They are biodegradable without damage to the environment.

Terpenes are widely available from many different plants and trees, including resins, sap, leaves and fruits. They are available in large quantities and at low cost.

DETAILED DESCRIPTION

Definitions

Figure 1:
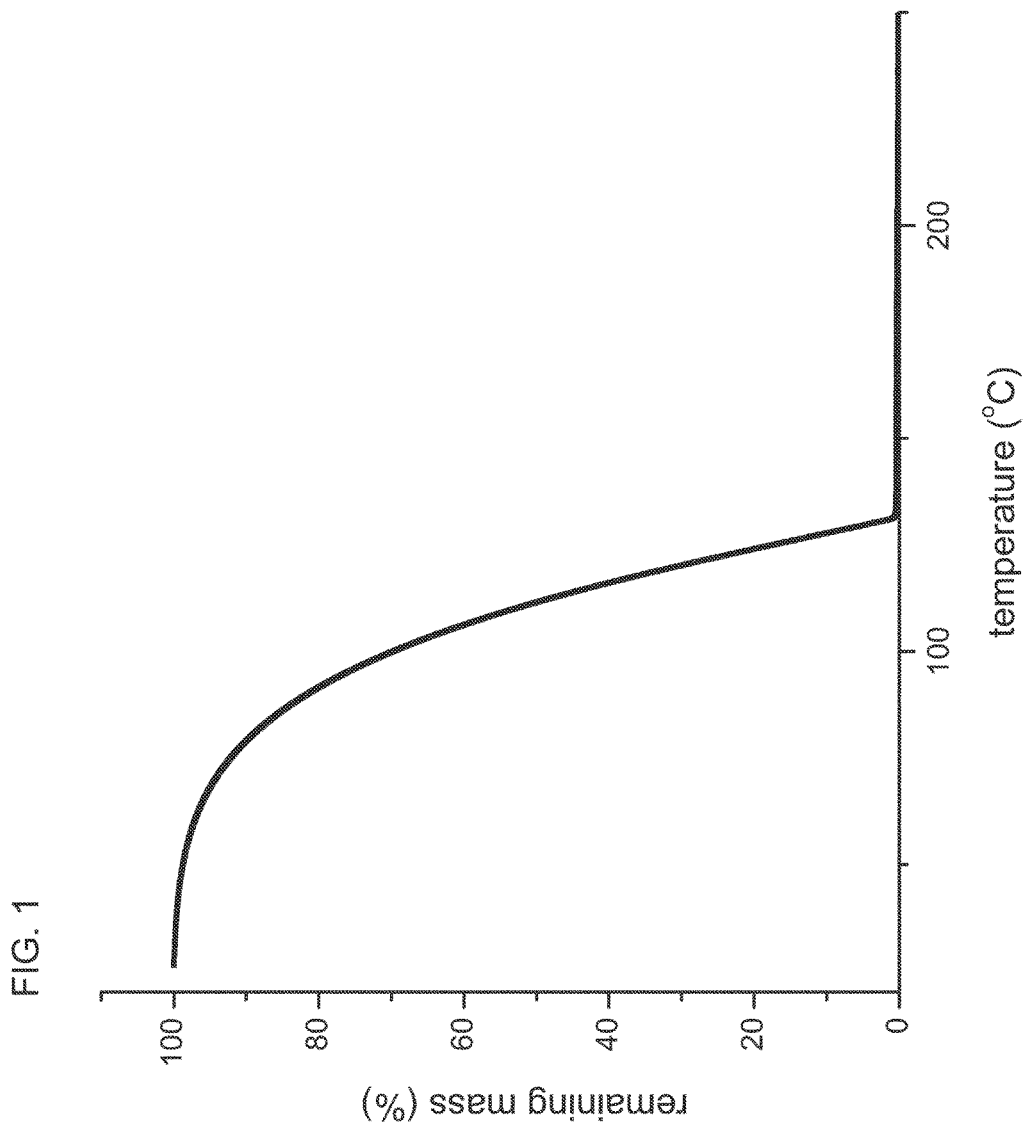
FIG. 1 shows a thermogravimetric analysis of alloocimene.

The term "terpene" is used in this disclosure to mean an organic molecule containing at least one unit of isoprene. One or more isoprene units may be linked together "head to tail" or "head to head" to form linear chains or they may be arranged to form rings. The terpene may be oxygenated.

The term "monoterpene" is used in this disclosure to mean a terpene containing two isoprene units.

The term "sesquiterpene" is used in this disclosure to mean a terpene containing three isoprene units.

The term "diterpene" is used in this disclosure to mean a terpene containing four isoprene units.

The term "triterpene" is used in this disclosure to mean a terpene containing six isoprene units.

The term "isoprene" is used in this disclosure to mean a molecule having the formula $C_5H_8$.

Solvents

In one or more embodiments, the monoterpene 7-methyl-3-methyleneocta-1,6-diene, also called beta-myrcene, is used as a solvent. It has formula 1, shown below:

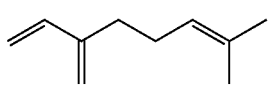

1

It may be used as a mixture of various isomers of structure 1.

In one or more embodiments, the monoterpene 3,7-dimethylocta-1,3,6-triene, also called beta-ocimene, is used as a solvent. It has formula 2,

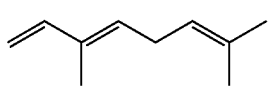

2

It may be used as a mixture of various isomers of structure 2.

In one or more embodiments, the monoterpene 2,6-dimethylocta-2,4,6-triene, also called alloocimene, is used as a solvent. It has formula 3,

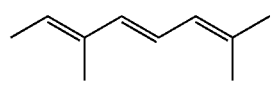

3

It may be used as a mixture of various isomers of structure 3.

In one or more embodiments, the sesquiterpene 3,7,11-trimethyldodeca-1,3,6,10-tetraene, also called alpha-farnesene, is used as a solvent. It has formula 4,

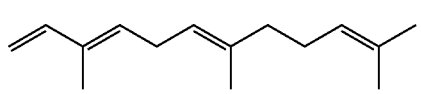

4

It may be used as a mixture of various isomers of structure 4.

In one or more embodiments, the sesquiterpene 7,11-dimethyl-3-methylenedodeca-1,6,10-triene, also called beta-farnesene, is used as a solvent. It has formula 5,

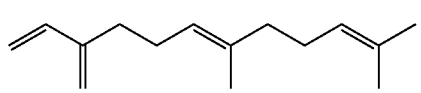

5

It may be used as a mixture of various isomers of structure 4. Commercial sources usually supply mixtures of farnesenes 4 and 5.

In some embodiments, a diterpene 3,7,11,15-tetramethyl-hexadeca-1,3,6,10,14-pentaene, also called alpha-springene, is used as a solvent. It has formula 6,

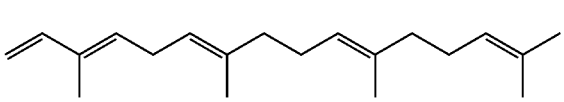

6

It may be used as a mixture of various isomers of structure 6.

In other embodiments, a triterpene, 2,6,10,15,19,23-hexamethyltetracosa-2,6,10,14,18,22-hexaene, also called squalene, is used as a solvent. It has formula 7,

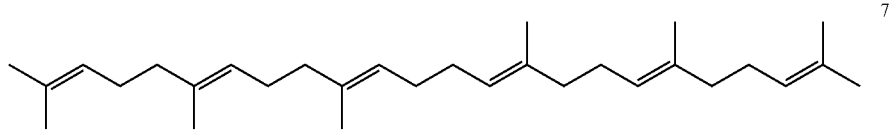 [SMILES: CC(C)=CCC/C(C)=C/CC/C(C)=C/CC/C=C(\C)CC/C=C(\C)CCC=C(C)C]

It may be used as a mixture of various isomers of structure 7.

Solutions

Many types of metal or metalloid precursors may be dissolved in terpenes and their solutions then used in CVD, ALD, SP and/or MD. The metals include, but are not limited to, any of the transition metals, main-group metals, lanthanide metals. Transition metals of interest include Ti, V, Cr, Mn, Fe, Co, Ni, Cu, Zn, Y, Zr, Nb, Mo, Ru, Rh, Pd, Ag, Cd, Hf, Ta, W, Re, Os, Ir, Pt and Au. Main group metals of interest include Li, Na, K, Mg, Ca, Sr, Ba, Al, Ga, In, Sn, Pb, Sb and Bi. Lanthanide metals of interest include La, Ce, Pr, Nd, Sm, Eu, Gd, Tb, Dy, Ho, Er, Tm, Yb and Lu. Metalloids of interest include B, Si, Ge, As and Te. The metal precursor compounds may contain metals bonded to anionic ligands that form amidinates, β-diketonates, β-thioketonates, β-ketoiminates, β-diiminates, alkoxides, dialkylamides, alkyls, cycloalkyls, cycloalkenyls such as cyclopentadienyls, halides, and/or neutral ligands such as carbonyls, trialkylamines, pyridines, trialkylphosphines, ethers, thioethers, nitriles, isonitriles, as well as heteroleptic compounds containing two or more of these ligands.

Figure 2:
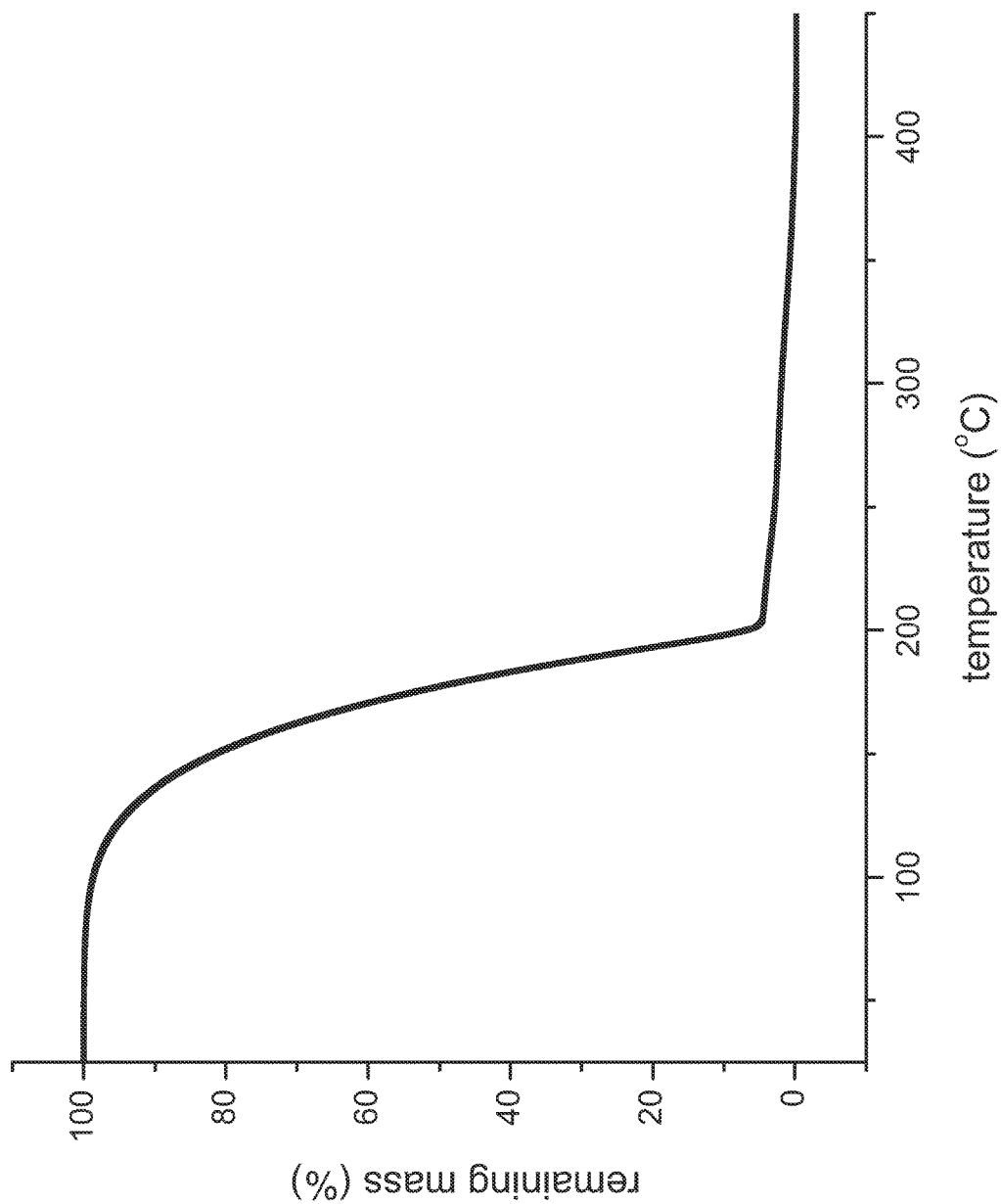
FIG. 2 shows a thermogravimetric analysis of mixed isomers of farnesenes.
Figure 3:
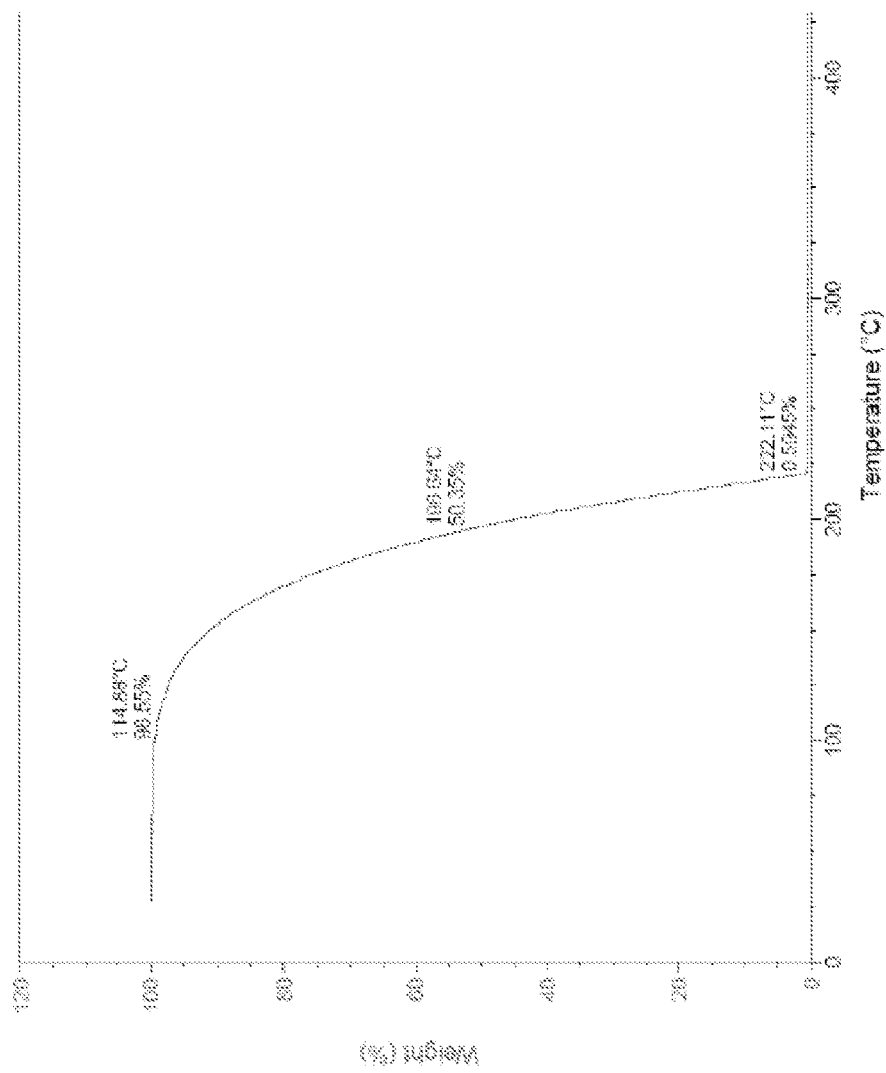
FIG. 3 shows a thermogravimetric analysis of a nickel amidinate precursor.

As a guide to the choice of a terpene solvent whose vaporization rate matches that of a metal precursor, thermogravimetric analysis (TGA) is useful. In TGA, a small amount (typically 10 to 20 milligrams) of the solvent or metal precursor is evaporated into a flowing stream of nitrogen gas. The remaining mass of the sample is recorded as a function of temperature. TGA data for alloocimene is plotted in FIG. 1. One half of its mass is lost by a temperature of 112° C., which is known as $T_{1/2}$. TGA data for farnesenes is plotted in FIG. 2. One half of its mass is lost by a temperature of 177° C. TGA of the nickel precursor, bis(N,N'-di-tert-butylacetamidinato)nickel(II), is shown in FIG. 3. One half of its mass is lost by 197° C. Comparison of these data show that farnesene solvent provides a good match to the vaporization rate of this nickel precursor, in that the difference between farnesene's $T_{1/2}$ and the nickel precursor's $T_{1/2}$ is only 20° C. Alloocimene vaporizes somewhat more quickly than the nickel precursor ($T_{1/2}$ for alloocimene is 85° C. below that of the nickel precursor), but it is still a useful solvent for use in vaporization of this precursor. In some embodiments, when matching a terpene solvent and a metal precursor based on vaporization rates, the difference in $T_{1/2}$ values between precursor and solvent is less than 100° C. In other embodiments, the difference in $T_{1/2}$ values between precursor and solvent is less than 50° C. In still other embodiments, the difference in $T_{1/2}$ values between precursor and solvent is less than 25° C.

Useful concentrations of the solutions are larger than 0.25 molar in some embodiments, larger than 0.5 molar in other embodiments, and larger than 1 molar in still other embodiments.

As a first step in the use of these solutions in CVD, ALD, SP or MD processes, they may be nebulized into a mist of small droplets. Conventional nebulization or spray equipment may be used. For example, U.S. Pat. No. 6,180,190 describes an ultrasonic nebulizer suitable for use with these solutions. Commercial systems for vaporization of solutions are sold by Brooks Instrument Company, MKS Instruments, Kemstrean and other companies. In some cases, the solution may be vaporized for use in CVD or ALD without nebulization; see for example the method described in the Review of Scientific Instruments, volume 74, pages 3879-3980 (2008), in which the solution flows down a heated tube along with a carrier gas.

Example 1

Solution of a Nickel Amidinate in Alloocimene

A nickel precursor, bis(N,N'-di-tert-butylacetamidinato)nickel(II),

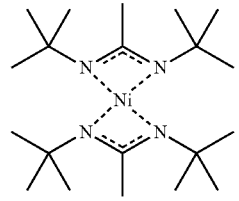

was dissolved in alloocimene. Its solubility was found to be over 40 weight percent. The density of the solution is 0.97 g cm$^{-3}$, corresponding to a volume concentration over 1.0 molar.

Example 2

Solution of a Nickel Amidinate in Farnesene Isomers

The nickel precursor, bis(N,N'-di-tert-butylacetamidinato)nickel(II), of Example 1, was dissolved in mixed isomers of farnesene. Its solubility was found to be over 37 weight percent. The density of the solution is 0.96 g cm$^{-3}$, corresponding to a volume concentration over 0.9 molar.

Comparative Example 1

Solution of a Nickel Amidinate in a Saturated Hydrocarbon

Examples 1 and 2 were repeated except that dodecane was used as a solvent in place of alloocimene or farnesenes. The solubility was around 0.25 molar.

Example 3

Solution of a Copper Amidinate in Farnesene Isomers

A copper amidinate precursor, copper(I) (N,N'-di-sec-butylacetamidinate),

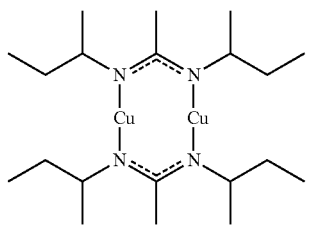

is dissolved in mixed isomers of farnesene. Its solubility is high.

Example 4

Solution of a Yttrium Amidinate in Farnesene Isomers

A yttrium precursor, tris(N,N'-diisopropylacetamidinato) yttrium(III),

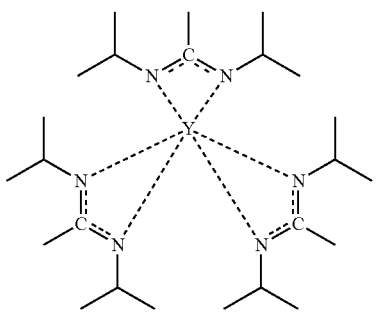

is dissolved in mixed isomers of farnesenes. Its solubility is high.

Example 5

Solution of a Lanthanum Amidinate in Farnesene Isomers

A lanthanum precursor, tris(N,N'-diisopropylformamidinato)lanthanum(III),

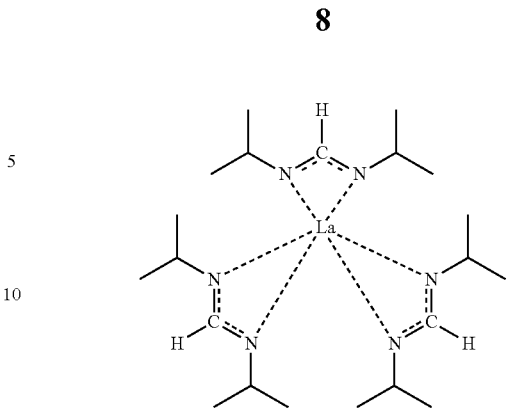

is dissolved in mixed isomers of farnesenes. Its solubility is high.

Example 6

Solution of a Cobalt Amidinate in Alloocimene

A cobalt amidinate precursor, bis(N,N'-diisopropylacetamidinato)cobalt(II),

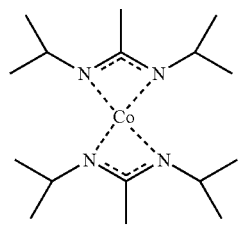

is dissolved in alloocimene. Its solubility is high.

Example 7

Solution of a Manganese Amidinate in Farnesene Isomers

A manganese amidinate precursor, bis(N,N'-diisopropylpentamidinato)manganese(II),

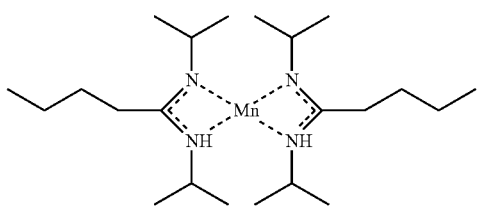

is dissolved in mixed isomers of farnesene. Its solubility is high.

Example 8

CVD of Nickel Nitride Using a Solution in Alloocimene

A solution prepared as in Example 1 is flowed at a rate of 0.1 g min$^{-1}$ and vaporized into a 60 sccm flow of pure nitrogen gas, and mixed with a flow of 30 sccm ammonia gas and 30 sccm hydrogen gas. This gas mixture is passed into a cylindrical deposition chamber with 3.5 cm inner diameter held at a temperature of 160° C. and a total pressure of 5 Torr. Substrates of silicon and glass resting on a half-cylinder in the deposition chamber are coated with nickel nitride.

It is recognized, of course, that those skilled in the art may make various modifications and additions to the processes and solutions of this disclosure without departing from the spirit and scope of the present contribution to the art. Accordingly, it is to be understood that the protection sought to be afforded hereby should be deemed to extend to the subject matter of the claims and all equivalents thereof fairly within the scope of this disclosure.

What is claimed is:

1. A liquid solution comprising:
an acyclic, terpene solvent; and
a precursor containing at least one metal or metalloid atom;
wherein the terpene solvent is a liquid;
wherein the terpene solvent and the precursor have vaporization rates in which the $T_{1/2}$ values of the terpene solvent and the precursor differ by less than 100° C., as determined by thermogravimetric analyses; and
wherein the liquid solution is suitable for use in one of chemical vapor deposition and atomic layer deposition.

2. The solution of claim 1, wherein the terpene is alloocimene.

3. The solution of claim 1, wherein the terpene is farnesene.

4. The solution of claim 1, wherein the terpene is a monoterpene.

5. The solution of claim 1, wherein the terpene is a sesquiterpene.

6. The solution of claim 1, wherein the terpene is a diterpene.

7. The solution of claim 1, wherein the terpene is a triterpene.

8. The solution of claim 4, wherein the monoterpene has the formula,

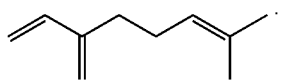

9. The solution of claim 4, wherein the monoterpene has the formula,

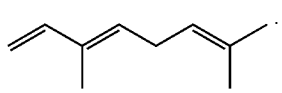

10. The solution of claim 4, wherein the monoterpene has the formula,

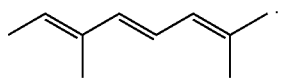

11. The solution of claim 5, wherein the sesquiterpene has the formula,

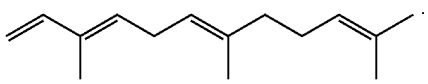

12. The solution of claim 5, wherein the sesquiterpene has the formula,

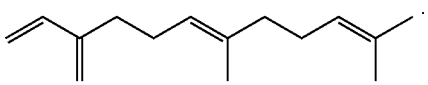

13. The solution of claim 6, wherein the diterpene has the formula,

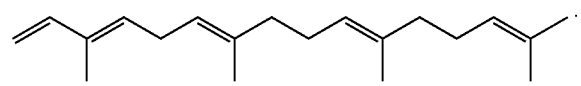 [SMILES: C=C/C(C)=C/C/C=C(\C)CC/C=C(\C)CCC=C(C)C]

14. The solution of claim 7, wherein the triterpene has the formula,

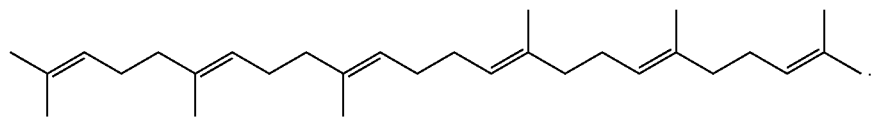 [SMILES: CC(C)=CCC/C(C)=C/CC/C(C)=C/CC/C=C(\C)CC/C=C(\C)CCC=C(C)C]

15. The solution of claim 1, wherein the precursor is bis(N,N'-di-tert-butylacetamidinato) nickel(II) and the acyclic terpene solvent is alloocimene.

16. The solution of claim 1, wherein the precursor is bis(N,N'-di-tert-butylacetamidinato)nickel(II) and the acyclic terpene solvent is farnesene.

17. The solution of claim 1, wherein the concentration of the solution is from 0.25 to 0.50 molar.

18. The solution of claim 1, wherein the concentration of the solution is from 0.5 to 1.0 molar.

19. The solution of claim 1, wherein the concentration of the solution is greater than 1 molar.

20. The solution of claim 1, wherein the $T_{1/2}$ values of the precursor and the solvent differ by less than 50° C., as determined by thermogravimetric analyses.

21. The solution of claim 1, wherein the $T_{1/2}$ values of the precursor and the solvent differ by less than 25° C., as determined by thermogravimetric analyses.

* * * * *